United States Patent
Tsao et al.

(10) Patent No.: US 7,417,321 B2
(45) Date of Patent: Aug. 26, 2008

(54) VIA STRUCTURE AND PROCESS FOR FORMING THE SAME

(75) Inventors: Jung-Chih Tsao, Taipei (TW); Kei-Wei Chen, Yung-ho (TW); Ying-Jing Lu, Daliao Township, Kaohsiung County (TW); Yu-Sheng Wang, Tainan (TW); Yu-Ku Lin, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 11/323,484

(22) Filed: Dec. 30, 2005

(65) Prior Publication Data
US 2007/0152342 A1    Jul. 5, 2007

(51) Int. Cl.
H01L 23/48    (2006.01)
H01L 23/52    (2006.01)
H01L 29/40    (2006.01)

(52) U.S. Cl. ............... 257/774; 257/773; 257/E21.577; 257/E21.174; 257/E21.175; 257/E21.583

(58) Field of Classification Search ................. 257/774, 257/773, E21.577, E21.175, E21.174, E21.583
See application file for complete search history.

(56) References Cited

U.S. PATENT DOCUMENTS

| | | | | |
|---|---|---|---|---|
| 6,211,069 B1 * | 4/2001 | Hu et al. | ..................... | 438/637 |
| 6,498,091 B1 * | 12/2002 | Chen et al. | ................... | 438/627 |
| 6,953,742 B2 * | 10/2005 | Chen et al. | ................... | 438/622 |
| 7,244,674 B2 * | 7/2007 | Li et al. | ........................ | 438/643 |
| 2002/0127849 A1 * | 9/2002 | Lin et al. | ..................... | 438/638 |
| 2003/0087520 A1 * | 5/2003 | Chen et al. | ................... | 438/643 |
| 2003/0218256 A1 * | 11/2003 | Merchant et al. | ............ | 257/774 |
| 2004/0147104 A1 * | 7/2004 | Lin et al. | ..................... | 438/598 |
| 2004/0157425 A1 * | 8/2004 | Catabay et al. | ............. | 438/597 |
| 2004/0209460 A1 * | 10/2004 | Xi et al. | ....................... | 438/643 |
| 2005/0074968 A1 * | 4/2005 | Chen et al. | ................... | 438/643 |
| 2005/0255690 A1 * | 11/2005 | Chen et al. | ................... | 438/627 |
| 2006/0154464 A1 * | 7/2006 | Higashi | ....................... | 438/597 |
| 2006/0202345 A1 * | 9/2006 | Barth et al. | .................. | 257/761 |
| 2007/0252278 A1 * | 11/2007 | Li et al. | ....................... | 257/751 |

* cited by examiner

*Primary Examiner*—Michelle Estrada
*Assistant Examiner*—Jarrett J Stark
(74) *Attorney, Agent, or Firm*—Thomas, Kayden, Horstemeyer & Risley

(57) ABSTRACT

Via structure and process flow for interconnection in a semiconductor product. A bottom metal layer is provided to represent a connection layer in the semiconductor product. An isolation layer on the bottom metal layer comprises a via hole exposing a portion of the bottom metal layer. The via hole comprises a sidewall and a bottom. A first barrier metal layer is disposed on the sidewall of the via hole, but not on the bottom of the via hole. A metal under-layer is formed on the bottom of the via hole and on the first barrier metal layer. A second barrier metal layer is formed on the metal under-layer. A metal fill layer fills the via hole. A lattice mismatch between the metal under-layer and the second barrier metal layer is less than about 5%.

16 Claims, 10 Drawing Sheets

| | Crystal struc. | Lattice constant | Nearest Neighbor | Lattice mismatch | α Ta formation |
|---|---|---|---|---|---|
| α Ta (110) | bcc | 3.306 | 2.863 | 0.0% | V |
| β Ta (002) | tetragonal | 5.316 / 10.194 | 5.316 | 71.9% | X |
| W (110) | bcc | 3.16 | 2.737 | 4.6% | V |
| Ti | hcp | 2.95 / 4.67 | 2.950 | 2.9% | V |
| Al (111) | fcc | 4.04 | 2.857 | 0.2% | V |
| Cu (111) | fcc | 3.615 | 2.556 | 12.0% | X |
| $TaN_{0.1}$ (110) | bcc | 3.369 | 2.918 | 1.9% | V |
| TaN (111) | fcc | 4.339 | 3.068 | 6.7% | X |

|  | Crystal struc. | Lattice constant | Nearest Neighbor | Lattice mismatch | α Ta formation |
|---|---|---|---|---|---|
| α Ta (110) | bcc | 3.306 | 2.863 | 0.0% | V |
| β Ta (002) | tetragonal | 5.316<br>10.194 | 5.316 | 71.9% | X |
| W (110) | bcc | 3.16 | 2.737 | 4.6% | V |
| Ti | hcp | 2.95<br>4.67 | 2.950 | 2.9% | V |
| Al (111) | fcc | 4.04 | 2.857 | 0.2% | V |
| Cu (111) | fcc | 3.615 | 2.556 | 12.0% | X |
| $TaN_{0.1}$ (110) | bcc | 3.369 | 2.918 | 1.9% | V |
| TaN (111) | fcc | 4.339 | 3.068 | 6.7% | X |

FIG. 8

VIA STRUCTURE AND PROCESS FOR FORMING THE SAME

BACKGROUND

The present invention relates in general to semiconductor products. More particularly, it relates to via structures used in semiconductor products.

The escalating requirements for high density and performance associated with ultra large scale integration (ULSI) semiconductor device wiring are difficult to satisfy in terms of providing sub-micro-sized, low resistance-capacitance (RC) metallization patterns. This is particularly applicable when the sub-micro-features, such as vias, contact areas, lines, trenches, and other shaped openings or recesses have high aspect ratios (depth-to-width) due to miniaturization.

Copper (Cu) or copper-based alloy has been used as the major material for semiconductor wiring to replace aluminum (Al), due to the low resistance and high melting point provided by Cu. Cu, however, lacks excellent properties that Al has. For example, Cu cannot form a dense protective layer such as $Al_2O_3$, has bad adhesive strength to $SiO_2$, and is difficult to dry-etch. In addition, its diffusion coefficient in silicon is approximately $10^6$ times larger than that of Al, and it is known that Cu diffused into the silicon forms a deep level in a band gap. Furthermore, copper's diffusion coefficient in $SiO_2$ is known to be large, which decreases the ability of $SiO_2$ to insulate between Cu lines. As a result of copper's large diffusion coefficient in silicon and $SiO_2$, the reliability of the semiconductor device is reduced. Accordingly, to ensure the reliability of the device, a diffusion barrier layer capable of blocking Cu from rapidly diffusing into the silicon or $SiO_2$ is required.

FIG. 1 shows the general concept of a dual damascene process for manufacturing Cu lines with a barrier layer. An inter-metal dielectric (IMD) or an inter-layer dielectric (ILD) 100 is patterned through lithographic and etch processes to define a trench and a via hole. A diffusion barrier layer and a seed layer are then deposited to coat the trench, the via hole, and the top surface of the dielectric layer. Through the assistance from the seed layer, Cu is then plated on the entire surface to fill the trench and the via hole. Chemical mechanical planarization can be used to remove the excessive copper on the top surface of the dielectric layer. Copper in the trench and the via hole respectively provide lateral and vertical electronic connections.

The general requirements for barrier layers include:
step coverage on high aspect ratio via holes and trenches;
low thin film resistivity;
adhesion to the IMD or ILD;
adhesion to Cu;
stability at all process temperatures;
compatibility to the IMD or ILD;
compatibility to CMP process; and
resistance to Cu diffusion.

In view of these requirements, Ta and/or TaN thin films deposited by a sputtering process are currently being used as the diffusion barrier layer for Cu. Challenge for forming a better diffusion layer, however, still remains.

SUMMARY

An embodiment of the invention provides a via structure for interconnection in a semiconductor product. A bottom metal layer is provided to represent a connection layer in the semiconductor product. An isolation layer on the bottom metal layer comprises a via hole exposing a portion of the bottom metal layer. The via hole comprises a sidewall and a bottom. A first barrier metal layer is disposed on the sidewall of the via hole, but not on the bottom of the via hole. A metal under-layer is formed on the bottom of the via hole and on the first barrier metal layer. A second barrier metal layer is formed on the metal under-layer. A metal fill layer fills the via hole. A lattice mismatch between the metal under-layer and the second barrier metal layer is less than about 5%.

An embodiment of the invention provides a method for fabricating a via for interconnection in a semiconductor product. A substrate with a bottom metal layer is provided. The bottom metal layer represents a connection layer in the semiconductor product. An isolation layer is formed on the bottom metal layer, comprising a via hole exposing a portion of the bottom metal layer. The via hole comprises a sidewall and a bottom. A first barrier metal layer is deposited on the sidewall of the via hole and on the bottom of the via hole. The first barrier metal layer is resputtered to remove the first barrier metal layer at the bottom of the via hole and to thicken the first barrier metal layer on the sidewall of the via hole. A metal under-layer is deposited on the first barrier metal layer and on the bottom of the via hole. A second barrier metal layer is deposited on the metal under-layer. A metal fill layer is formed to fill the via hole.

DESCRIPTION OF THE DRAWINGS

For a better understanding of embodiments of the present invention, reference is made to a detailed description to be read in conjunction with the accompanying drawings, in which:

FIG. 8 is a table showing experimental results whether α-phase Ta can be formed on exemplified materials.

DETAILED DESCRIPTION

Figure 3A:
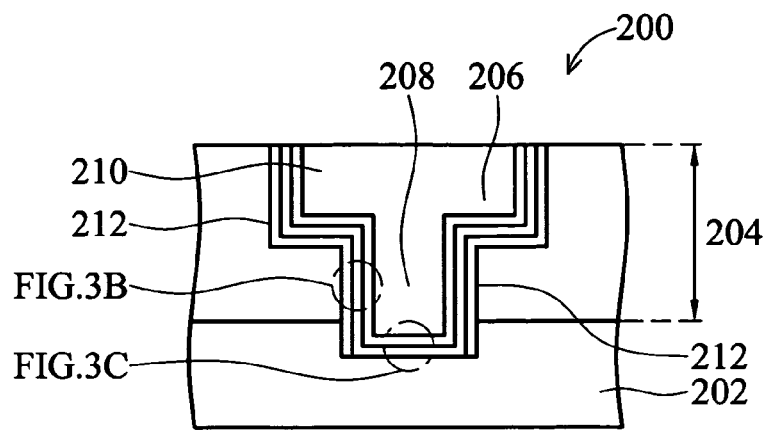
FIG. 3A is a cross section of a via structure 200 according to an-embodiment of the present invention.

FIG. 3A is a cross section of a via structure 200 according to an embodiment of the present invention. The via structure 200 is exemplified by way of, but is not limited to, a dual damascene structure. After comprehending the embodiments of the present invention, a person skilled in the art can understand that the via structure according to a present invention is also applicable to a single damascene structure.

A bottom metal layer 202 is formed on a substrate, which may have a number of electronic devices, such as transistors, capacitors, resisters, and diodes, fabricated by any wellknown processes in the art. Bottom metal layer 202 represents a connection layer in the semiconductor product. Generally, metal layers for interconnection are identified by layer numbers. The metal layer closest to the silicon substrate is generally referred as metal 1, the successive metal layer is generally referred as metal 2, and so on. The bottom metal layer 202, here, is not limited to any specific metal layer.

An isolation layer 204 with trench 206 and via hole 208 is on bottom metal layer 202. In a dual damascene structure, isolation layer 204 is known as an IMD layer, providing isolation between metal lines in trenches and between metal lines in different metal layers. If bottom metal layer 202 belongs to metal x, metal, lines in trench 206 belong to metal x+1 and the conductor in via hole 208 connects these two metal layers. Isolation layer 204 may be a single layer or a composite layer. The material for isolation layer 204 can be silicon oxide, silicon nitride, silicon oxynitride, any low-K dielectric or a combination of the foregoing as known in the art.

Figure 3B:
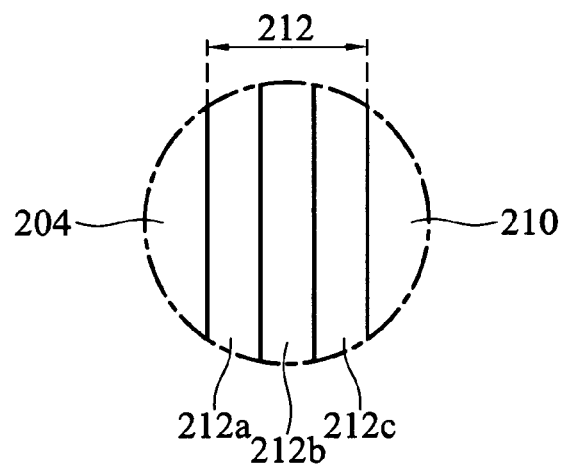
FIGS. 3B and 3C show schematics detailing the composite diffusion barrier layer 212 on the sidewall and the bottom of via hole 208, respectively.
Figure 3C:
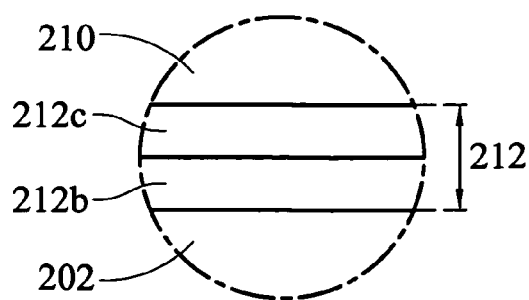

A metal fill layer 210, such as Cu, fills up via hole 208 and trench 206, but is separated from isolation layer 204 by a composite diffusion barrier layer 212, to reduce Cu diffusion. It is understood that isolation layer 204 is composed of different layers at different locations. FIGS. 3B and 3C show schematics detailing the composite diffusion barrier layer 212 on the sidewall and the bottom of via hole 208, respectively. As shown in FIG. 3B, on the sidewall of via hole 208, composite diffusion barrier layer 212 has at least three layers, including first barrier metal layer 212a, metal under-layer 212b and second barrier metal layer 212c. As shown in FIG. 3C, composite diffusion barrier layer 212 on the bottom of via hole 208 is similar to that on the sidewall of via hole 208 except that first barrier metal layer 212a is not on the bottom of via hole 208.

First and second barrier metal layer (212a and 212c) can be any known metal suitable for a diffusion barrier layer, such as Ta, TaN, or TaSiN. The first barrier metal layer 212a may be TaN among other materials, and second barrier metal layer 212c may be Ta among other materials. In one embodiment of the present invention, it is preferred to have a lattice mismatch between metal under-layer 212b and second barrier metal layer 212c less than about 5%. The reason for doing so will be explained later. W, Ti, Al, and Nb each having a lattice mismatch less than 5% in comparison with Ta, can be a candidate for metal under-layer 212b when second barrier metal layer 212c is Ta.

FIGS. 4A to 4F are cross sections at different steps during fabricating via structure 200 of FIG. 3A.

A substrate with a bottom metal layer 202 is provided. Isolation layer 204 is then deposited on bottom metal layer 202 by any known deposition process, such as chemical vapor deposition (CVD), spin-on coating, and the like. Conventional lithographic and etch technique can be utilized to define locations of trench 206 and via hole 208, and generate the result in FIG. 4A.

Figure 4A:
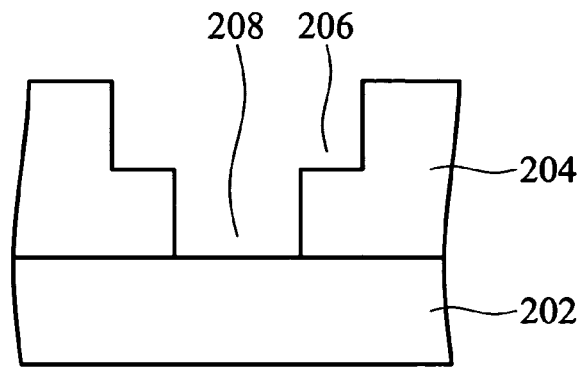
FIGS. 4A to 4F are cross sections at different steps during fabricating via structure 200 of FIG. 3A.
Figure 4B:
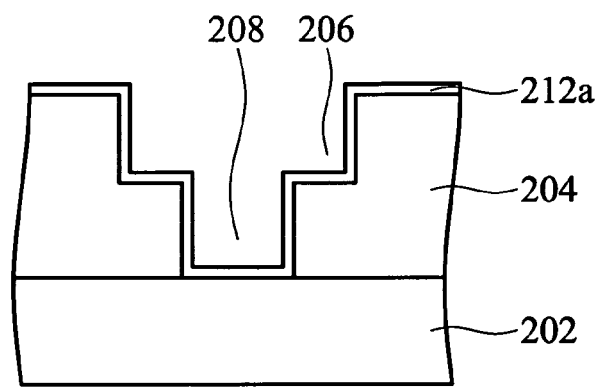

FIG. 4B shows first barrier metal layer 212a of TaN deposited on isolation layer 204. For example, first barrier metal layer 212a can be deposited by sputtering and has a thickness about from 50 to 200 Å, in which 135 Å is preferred. It is well known in the art that using sputtering may result in poor step coverage, especially for those structures with high aspect ratios. First barrier metal layer 212a, if formed by sputtering, will be thinner on the bottom of via hole 208 and on the sidewalls of trench 206 and via hole 208 than those on the bottom of trench 206 and on the top surface of isolation layer 204.

Figure 4C:
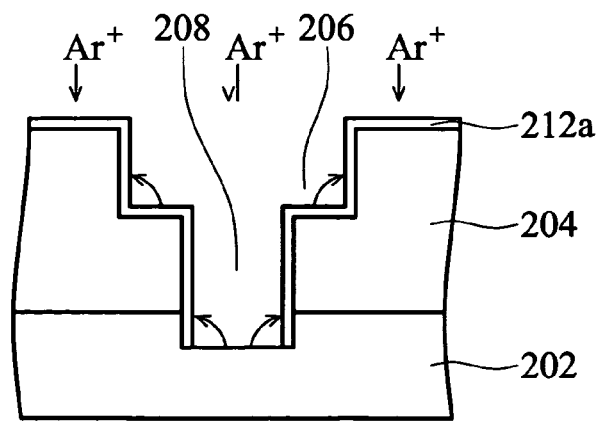

FIG. 4C shows the result after first barrier metal layer 212a is reversely sputtered (or resputtered in short). Resputtering uses non-active ions, such as Ar ion, to bombard a wafer, such that metal material on the wafer can be relocated or removed. By resputtering, first barrier metal layer 212a on sidewalls of via hole 208 and trench 206 can be thickened while those on the bottoms of via hole and trench and on the top surface of isolation layer 204 can be partially or completely removed. Any residue of first barrier metal layer 212a on the bottom of via hole 208 will make the formed via resistance high because of the high TaN sheet resistance, around 200 μΩ-cm. The residue also generates via resistance non-uniformity on an entire wafer. Therefore, it is preferred to completely remove the first barrier metal layer 212a on the bottom of via hole 208 while still keeping sufficient thickness of TaN on the surface of isolation layer 204 as a diffusion barrier. Resputter amount, the amount removed by resputtering, is preferred to be about 30% to 80% of first barrier metal layer 212a deposited on an open flat area of isolation layer 204. In one embodiment, resputter amount is 80 Å. After removing the first barrier metal layer 212a on the bottom of via hole 208, resputtering also recesses bottom metal layer 202, making via hole 208 have a bottom lower than a surface of bottom metal layer 202.

Figure 4D:
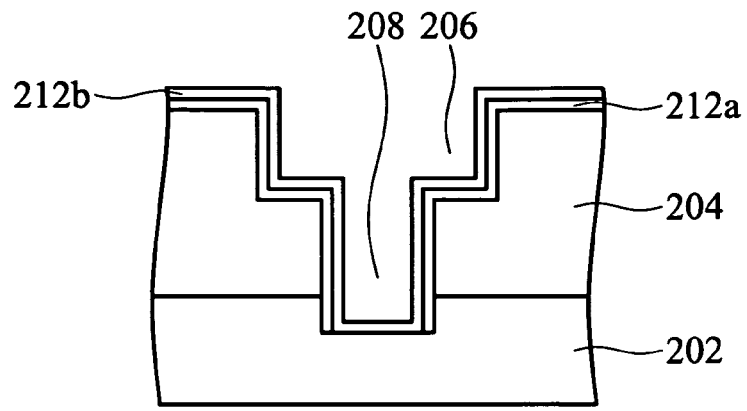

FIG. 4D shows the result after deposition of metal under-layer 212b. The material for metal under-layer 212b, for example, can be W, Ti, Al, or Nb, each having a lattice mismatch less than about 5% in comparison with Ta. In one embodiment, the thickness of metal under-layer 212b is 100 Å. The reason for having such a metal under-layer with a mismatch will be explained later. Resputtering for metal under-layer 212b is optional to improve its step coverage, but is omitted in one embodiment.

Figure 4E:
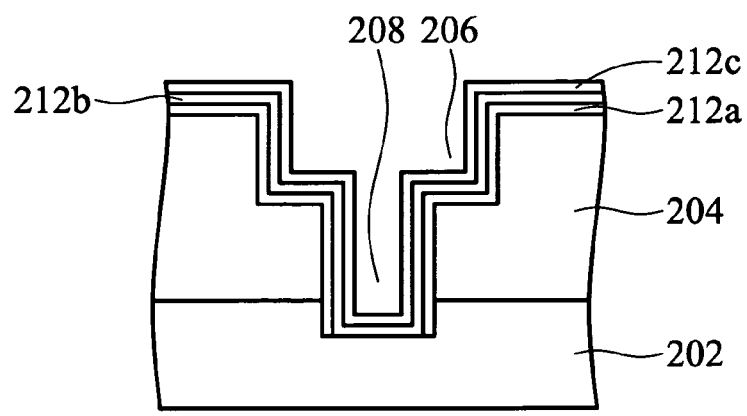

FIG. 4E shows the result after formation of second barrier metal layer 212c of Ta. Second barrier metal layer 212c can be deposited by sputtering to have a thickness about from 150 to 300 Å, in which 200 Å is preferred. If second barrier metal layer 212c is formed by sputtering, a following resputtering is preferred to improve the step coverage of second barrier metal layer 212c. The resputter amount for second barrier metal layer 212c is about from 50 to 150 Å, in which 80 Å is preferred.

Figure 4F:
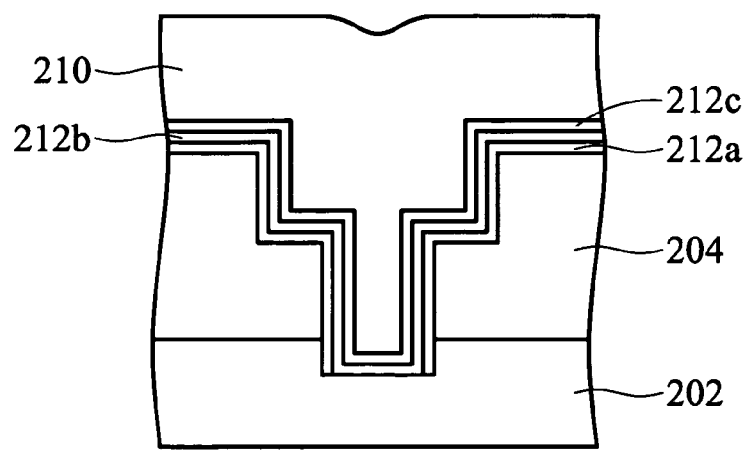

FIG. 4F shows the result after formation of metal fill layer 210. Metal fill layer 210, such as a Cu or Cu-based alloy layer, can be formed to fill trench 206 and via hole 208 by way of conventional Cu formation process. For example, a very thin seed layer of Cu (not shown) can be deposited on the surface of second barrier metal layer 212c. Then, by. way of well-known electroless or electroplating techniques, the thick filling layer 210, which fully fills trenches and via holes on the substrate, can be formed.

In order to prevent short circuit between metal lines in trenches, conductor on the top surface of isolation layer 204 must be removed. Conventional polishing process, such chemical mechanic planarization (CMP), can be utilized for this goal. The result after CMP has been shown in FIG. 3A.

Figure 5:
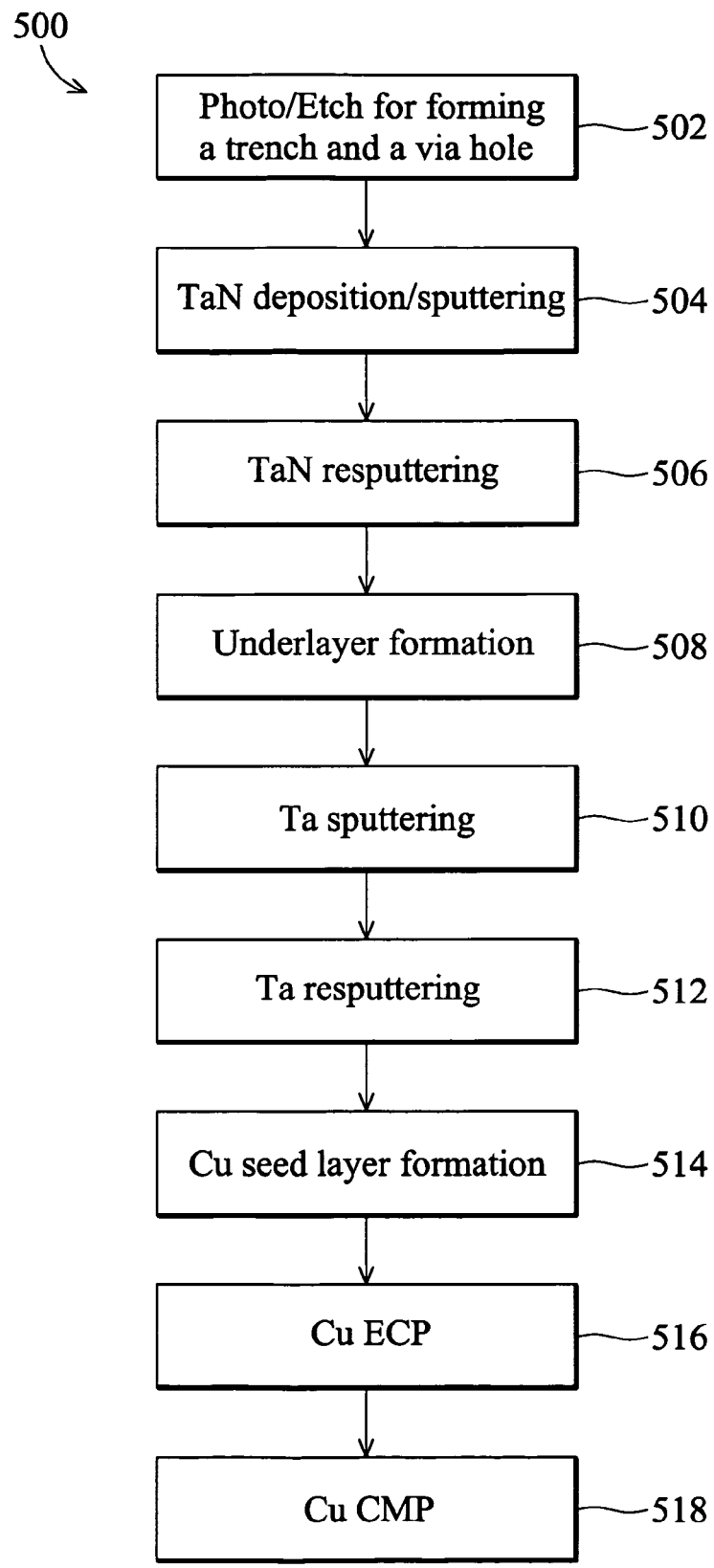
FIG. 5 shows a process flow 500 for forming a via structure according to an embodiment of the invention, summarizing the process steps for FIGS. 3A, and 4A-4F.

FIG. 5 shows a process flow 500 for forming a via structure according to an embodiment of the invention, summarizing the process steps for FIGS. 3A, and 4A-4F. In step 502, lithographic and etch technique is utilized to define locations of a trench and a via hole on an isolation layer. In step 504, a first barrier metal layer of TaN is deposited on the isolation layer by sputtering. In step 506 the first barrier metal layer is resputtered and a recess is formed on a bottom metal layer under the isolation layer. Step 508 forms a metal under-layer in the bottom of the via hole. Step 510 forms a second barrier metal layer of Ta on the metal under-layer. To improve the step coverage, the second barrier metal layer is resputtered in step 512. A Cu seed layer is formed in step 514 for preparation of electroplating. In step 516, a metal fill layer of Cu is formed by way of an electroless or electroplating technique to fill the trench and the via hole. Finally, a CMP process is performed to remove excessive conductor on the isolation layer, as shown in step 518.

Figure 1:
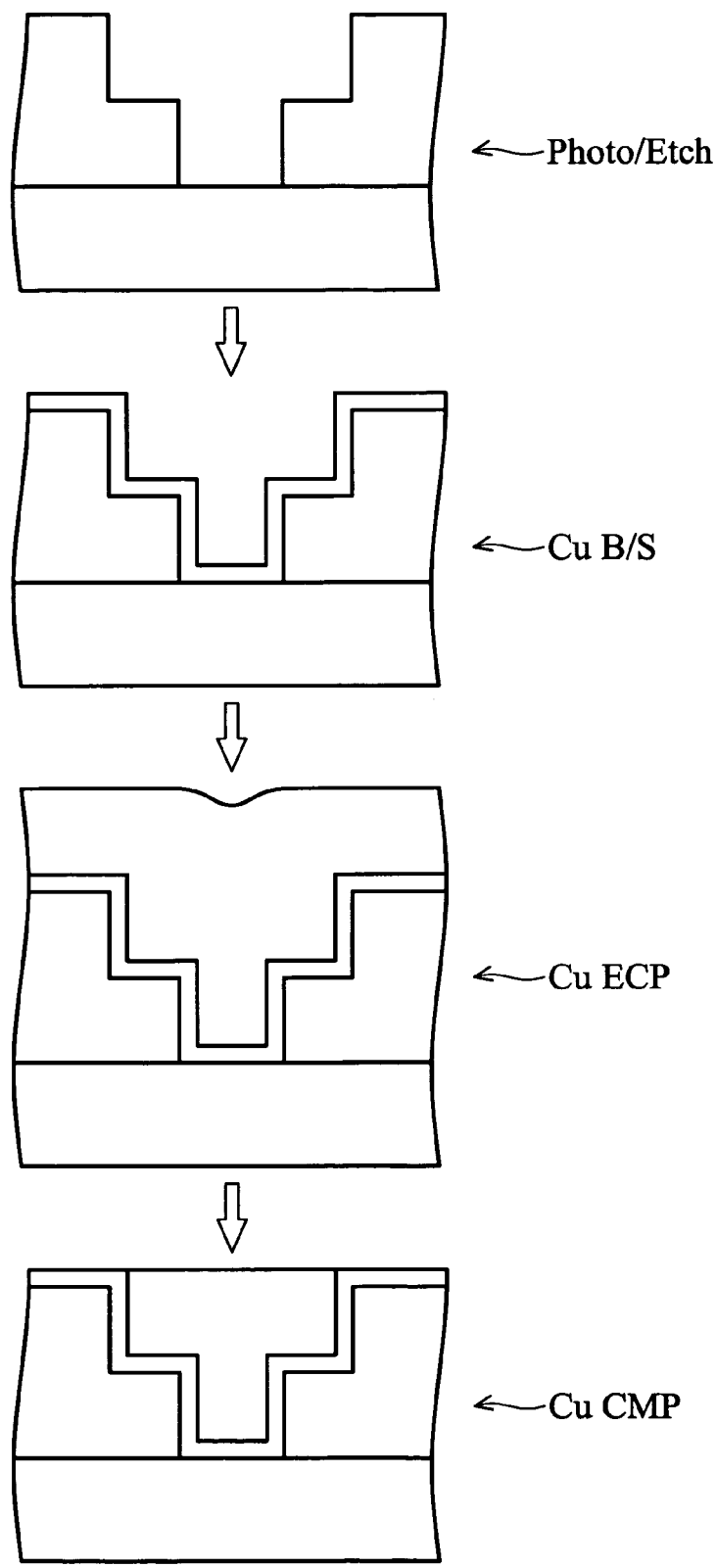
FIG. 1 shows the general concept of a dual damascene process for manufacturing Cu lines with a barrier layer.
Figure 2:
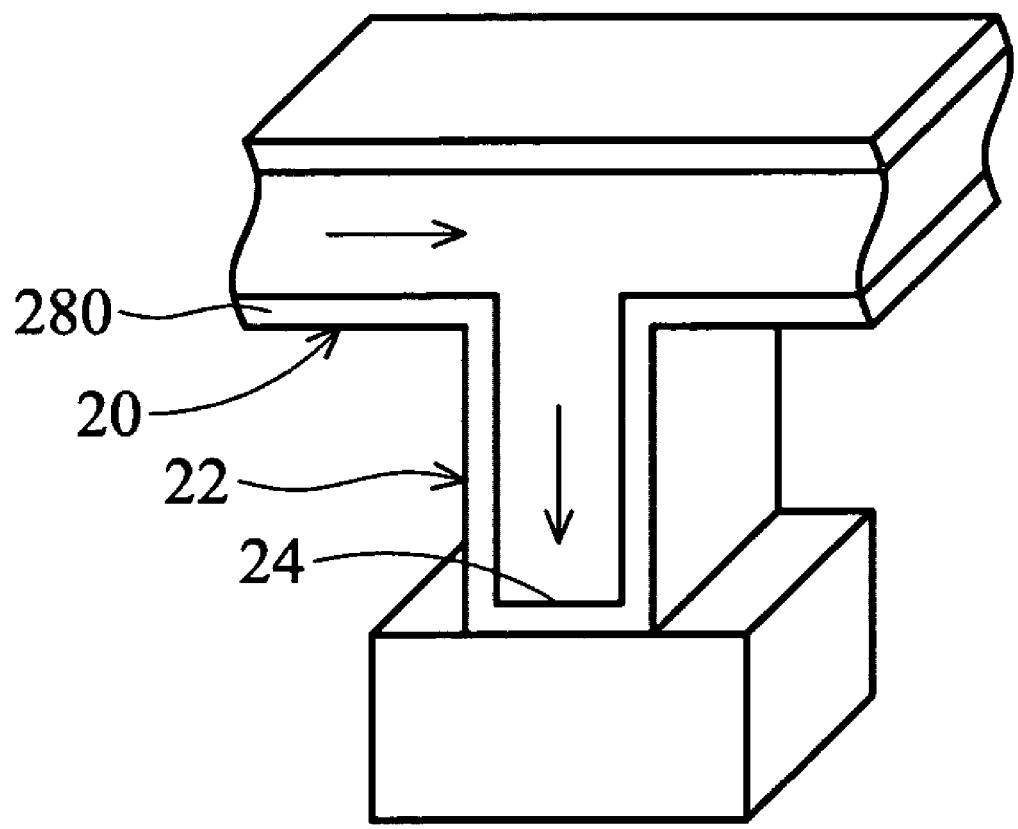
FIG. 2 illustrates wires and a via with current flow directions therein, to explain how the resistance of a barrier layer affects in a circuit connection.

FIG. 2 illustrates wires and a via with current flow directions therein, to explain how the resistance of a barrier layer 280 affects in a circuit connection. Due to the current flow direction, barrier layer 280 at locations 20 and 22, a bottom of a wire and a sidewall of a via, is connected in parallel with the low-resistant major conductive layer, and, therefore, slightly affects the totally resistance of the wire of the via if the resistance of the barrier layer is relatively large. Nevertheless, the barrier layer at location 24, the bottom of a via hole, is just located at the middle between top and bottom wires. In view of circuit connection, the barrier layer at location 24 is connected in series with the low-resistant major conductive material filling a via hole, and will contribute a lot to the via resistance if the resistance of-the barrier layer is relatively large.

The via resistance for a via structure with a metal under-layer under the second barrier metal layer will be lower in comparison with that for a via structure without the metal under-layer.

Figure 6:
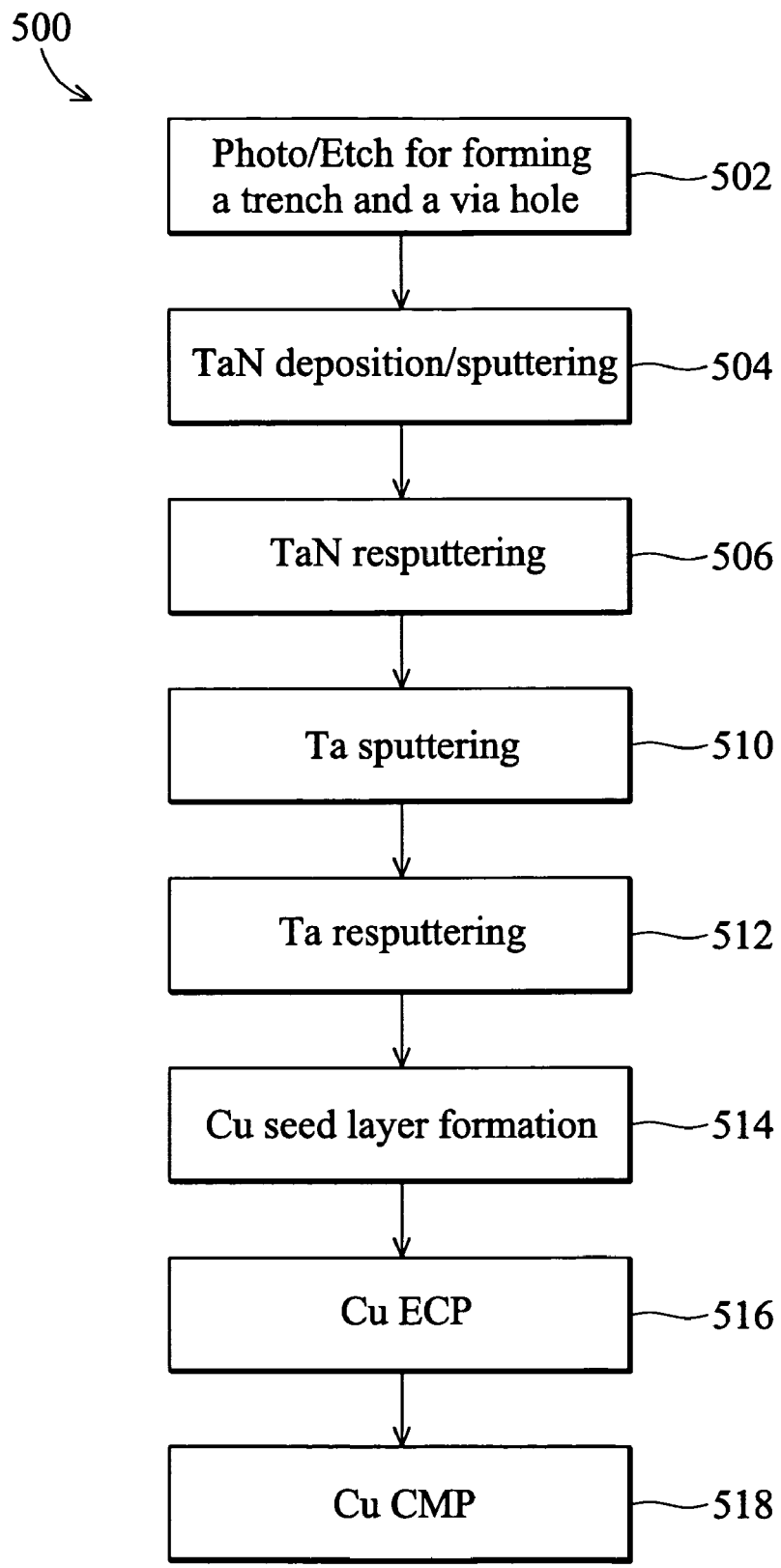
FIGS. 6 and 7A-7C are depicted to show a process flow and a via structure without the formation of under-layer 212b.
Figure 7A:
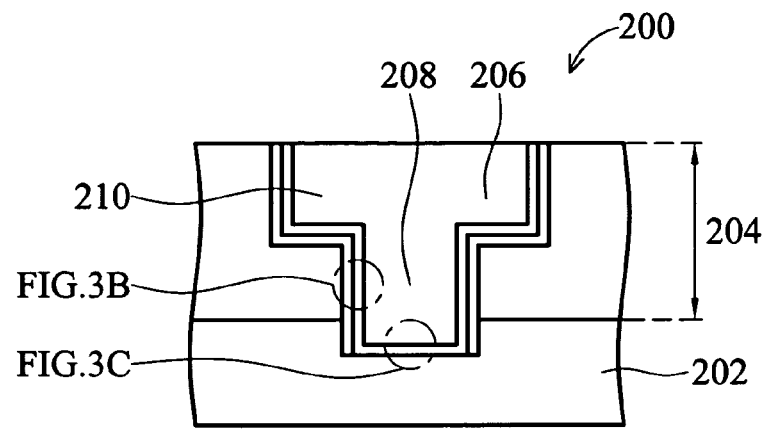
Figure 7B:
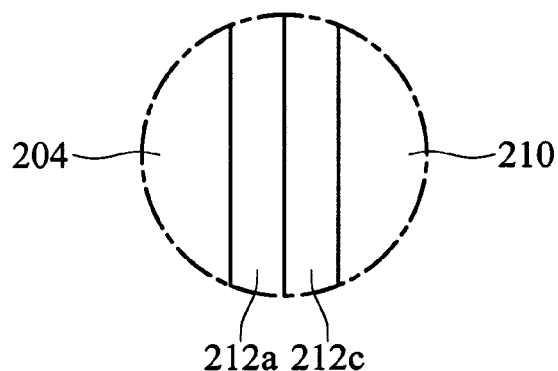
Figure 7C:
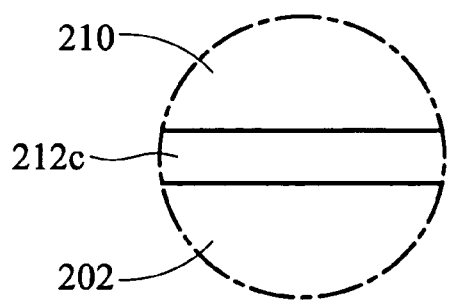

FIGS. 6 and 7A-7C are depicted to show a process flow and a via structure without the formation of under-layer 212b, to explain the role of metal under-layer 212b in the via structure. The steps of FIG. 6 are similar to the steps of FIG. 5, except that FIG. 6 lacks step 508 (forming a metal under-layer). Similarly, FIGS. 7A-7C are similar to FIGS. 3A-3C, except that there is no metal under-layer 212b between first and second barrier metal layer 212a and 212c. It is known in the art that tantalum exists in two phases, a low resistivity α-phase and a high resistivity β-phase. The low resistivity ($\rho$=15-30 $\mu\Omega$cm) of the bcc α-phase makes it the favorable candidate for damascene application, as it reduces the net resistance. It is also understood that a resputtered TaN can help the formation of α-phase when Ta is deposited by PVD, such as sputtering. Otherwise, the β-phase with resistivity value of 150-200 $\mu\Omega$cm forms easily. As shown in FIG. 7B, Ta of second barrier layer 212c on the sidewall of a via hole is in α-phase. Due to the removal of TaN at the bottom of the via hole 208, Ta of second barrier layer 212c there in FIG. 7C is unfortunately in β-phase and results a high via resistance. It becomes a dilemma because TaN at the bottom of a via hole 208 may remain for helping the formation of α-phase Ta but should be removed in consideration of its own high resistance (~200 $\mu\Omega$cm) and the entire wafer resistance uniformity.

A metal under-layer solves this dilemma. While TaN of high resistance at the bottom of a via hole 208 is completely removed, a metal under-layer is then formed, helping to form α-phase Ta. FIG. 8 is a table showing certain experimental results, which indicate whether α-phase Ta can be formed on those materials listed at the most left column. As shown in the rightmost column of the table, α-phase Ta can be formed on α-phase Ta, W of (110), Ti, Al of (111), and TaN$_{0.1}$ of (110), wherein (xyz) means a lattice direction. Lattice mismatch in FIG. 8 represents the difference in percentage between the nearest neighbor distances for α-phase Ta and the supporting material thereunder. It is concluded from FIG. 8 that if the neighbor distance of the supporting material is closer to that of α-phase Ta, there is a greater possibility for forming α-phase Ta thereon. In FIG. 8, TaN of (111), which has a lattice mismatch of 6.7%, form no α-phase Ta. Therefore, it is recommended to have a lattice mismatch less than 5% for forming α-phase Ta.

Figure 9:
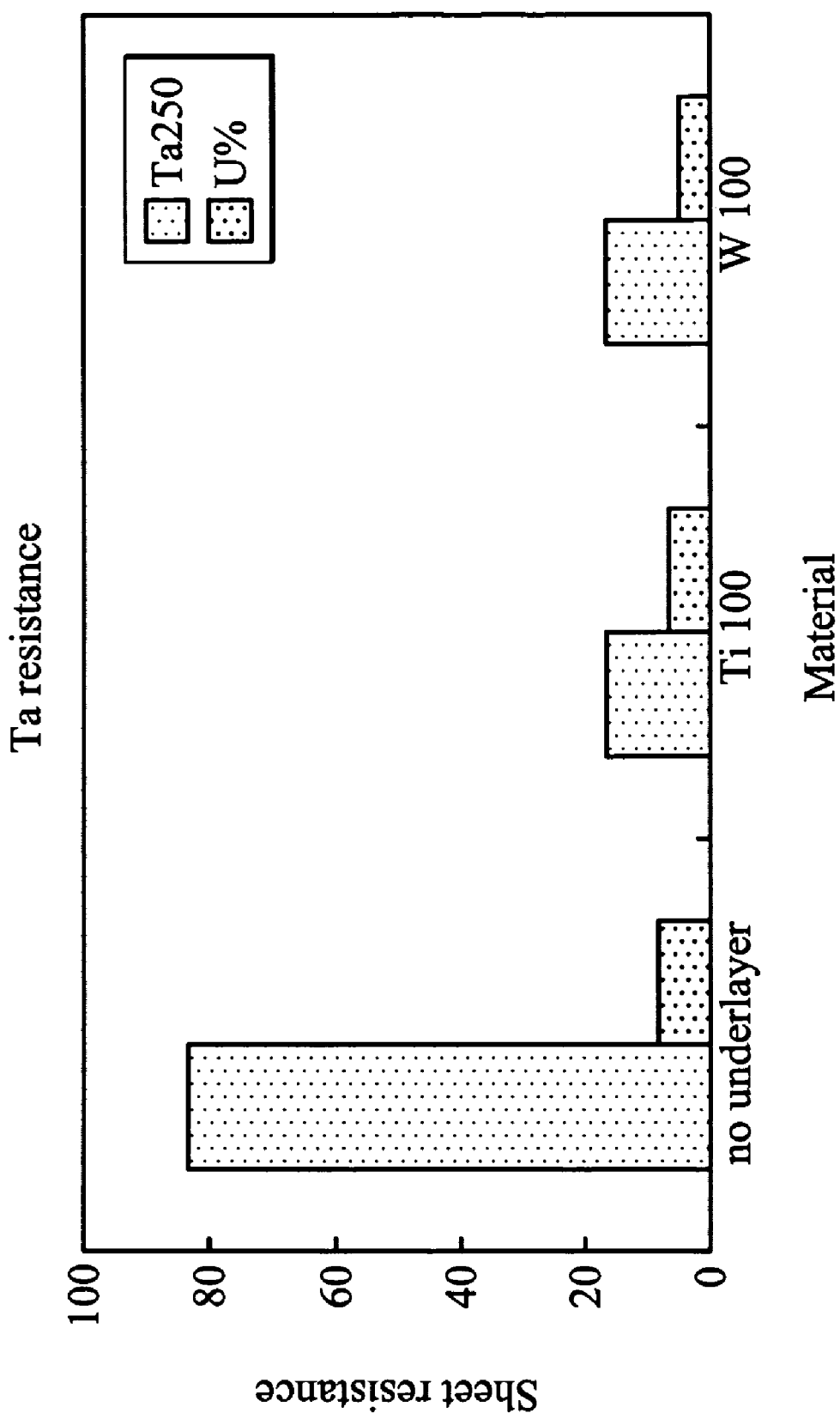
FIG. 9 shows measurement results from 3 different samples, each have a Ta layer of 250 Å thereon.

FIG. 9 shows measurement results from 3 different samples, each have a Ta layer of 250 Å thereon. The first sample has not metal under-layer, the middle one has a Ti layer of 100 Å as a metal under-layer, and the last one has a W layer of 100 Å as a metal under-layer. Even though each sample achieves good resistance uniformity on a wafer, the one without a metal under-layer gains worse (larger) resistance than those with a metal under-layer do, because the first sample forms a β-phase Ta layer while others form a α-phase Ta layer.

While the invention has been described by way of examples and in terms of preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A via structure for interconnection in a semiconductor product, comprising:
   a bottom metal layer, representing a connection layer in the semiconductor product;
   an isolation layer on the bottom metal layer, the isolation layer comprising a via hole exposing a portion of the bottom metal layer, the via hole comprising a sidewall and a bottom;
   a first barrier metal layer on the sidewall of the via hole and not on the center of the bottom of the via hole;
   a metal under-layer on the center of the bottom of the via hole and on the first barrier metal layer, wherein the metal under-layer comprises α-phase Ta, W of (110), Al of (111), or TaN$_{0.1}$ of (110), which (xyz) means a lattice direction;
   a second barrier metal layer on the metal under-layer; and
   a metal fill layer within the via hole;
   wherein a lattice mismatch between the metal under-layer and the second barrier metal layer is less than about 5%.

2. The via structure of claim 1, wherein the first barrier metal layer is TaN.

3. The via structure of claim 1, wherein the second barrier metal layer is Ta.

4. The via structure of claim 1, wherein the bottom of the via hole is lower than a surface of the bottom metal layer.

5. The via structure of claim 1, wherein the metal fill layer is Cu or Cu-based alloy.

6. The via structure of claim 1, wherein the metal under-layer is α-phase Ta.

7. The via structure of claim 1, wherein the metal under-layer is W of (110).

8. The via structure of claim 1, wherein the metal under-layer is Al of (111).

9. The via structure of claim 1, wherein the metal under-layer is TaN$_{0.1}$ of (110).

10. A semiconductor product, comprising:
    a bottom metal layer, representing a connection layer in the semiconductor product;
    a up metal layer above the bottom metal layer, representing another connection layer in the semiconductor product;
    an isolation layer substantially separating the top and the bottom metal layers, the isolation layer comprising a via hole exposing a portion of the bottom metal layer, the via hole comprising a sidewall and a bottom;
    a first barrier metal layer on the sidewall of the via hole and not on the center of the bottom of the via hole;
    a metal under-layer on the center of the bottom of the via hole and on the first barrier metal layer, wherein the metal under-layer comprises α-phase Ta, W of (110), Al of (111), and $TaN_{0.1}$ of (110), which (xyz) means a lattice direction;

a second barrier metal layer on the metal under-layer; and a metal fill layer filling the via hole, thereby connecting the up and the bottom metal layers.

11. The semiconductor product of claim 10, wherein a lattice mismatch between the metal under-layer and the second barrier metal layer is less than about 5%.

12. The semiconductor product of claim 10, wherein the bottom of the via hole is lower than a surface of the bottom metal layer.

13. The semiconductor product of claim 10, wherein the metal under-layer is α-phase Ta.

14. The semiconductor product of claim 10, wherein the metal under-layer is W of (110).

15. The semiconductor product of claim 10, wherein the metal under-layer is Al of (111).

16. The semiconductor product of claim 10, wherein the metal under-layer is $TaN_{0.1}$ of (110).

* * * * *